United States Patent [19]

Bachli et al.

[11] Patent Number: 6,114,256
[45] Date of Patent: *Sep. 5, 2000

[54] STABLE METALLIZATION FOR DIAMOND AND OTHER MATERIALS

[75] Inventors: Andreas Bachli, Baden, Switzerland; Elzbieta Kolawa, Sierra Madre, Calif.; Marc-Aurele Nicolet, Pasadena; Jan W. Vandersande, Upland, both of Calif.

[73] Assignee: California Institute of Technology, Pasadena, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/516,494

[22] Filed: Aug. 18, 1995

[51] Int. Cl.$^7$ .................................................. H01L 21/31
[52] U.S. Cl. ........................ 438/764; 438/785; 438/786; 438/653; 438/656
[58] Field of Search .................................. 437/173, 190; 438/105, 458, 459, 653, 656, 240, 396, 764, 785, 786

[56] References Cited

U.S. PATENT DOCUMENTS

| | | | |
|---|---|---|---|
| 4,574,298 | 3/1986 | Yamagishi et al. | 357/71 |
| 5,272,104 | 12/1993 | Schranta et al. | 437/63 |
| 5,334,306 | 8/1994 | Dautremont-Smith et al. | 205/131 |
| 5,391,257 | 2/1995 | Sullivan et al. | 156/630 |
| 5,399,238 | 3/1995 | Kumar | 156/643 |
| 5,436,505 | 7/1995 | Hayashi et al. | 257/763 |
| 5,605,858 | 2/1997 | Nishioka et al. | 438/396 |
| 5,696,018 | 12/1997 | Summerfelt et al. | 438/396 |
| 5,712,448 | 1/1998 | Vandersande et al. | 136/203 |
| 5,729,054 | 3/1998 | Summerfelt et al. | 257/751 |

OTHER PUBLICATIONS

Metallization Systems for Stable Ohmic Contacts to GaAs, J.L. Tandon et al., Mat. Res. Soc. 1985 Workshop, 1985.

Stable Solid–Phase Contact to n–GaAs, E. Kolawa et al., IEEE Trans. on Elec. Dev., vol. 36, No. 6, 1989.

Issues in Metal/Semiconductor Contact Design and Implementation, M.–A. Nicolet et al., Solar Cells 27, 1989.

Encapsulation of GaAs and GaAs–Pd in Furnace Annealing, J.M. Molarius et al., Vacuum, vol. 41, Nos. 4–6, 1990.

Amorphous Ta–Si–N Thin–Film Alloys as Diffusion Barrier in Al/Si Metallizations, E. Kolawa et al., J. Vac. Sci. Technol. A8(3), May/Jun. 1990.

Amorphous Ternary Ta–Si–N Diffusion Barrier Between Si and Au, P.J. Pokela et al., J. Electrochem. Soc., vol. 138, No. 7, Jul. 1991.

Tantalum–Based Diffusion Barriers in Si/Cu VLSI Metallizations, E. Kolawa et al., J. Appl. Phys. 70, 1369, Aug. 1991.

Thermal Oxidation of Amorphous Ternary $Ta_{36}Si_{14}N_{50}$ Thin Films, P.J. Pokela et al., J. Appl. Phys. 70, Sep. 1991.

Silicon Schottky Barriers and p–n Junctions with Highly Stable Aluminum Contact Metallization, L.E. Halperin et al., IEEE Electron Dev. Lett., vol. 12, No. 6, Jun. 1991.

Sputtered Ta–Si–N Diffusion Barriers in Cu Metallizations for Si, E. Kolawa et al., IEEE Electron Dev. Lett., vol. 12, No. 6, Jun. 1991.

Stress and Resistivity in Reactively Sputtered Amorphous Metallic Ta–Si–N Films, C.–K. Kwok et al., Mat. Res. Soc. Symp. Proc., vol. 226, 1991.

(List continued on next page.)

*Primary Examiner*—David Nelms
*Assistant Examiner*—Reneé R. Berry
*Attorney, Agent, or Firm*—Blakely Sokoloff Taylor & Zafman LLP

[57] ABSTRACT

An adherent and metallurgically stable metallization system for diamond is presented. The big improvement in metallurgical stability is attributed to the use of a ternary, amorphous Ti—Si—N diffusion barrier. No diffusion between the layers and no delamination of the metallization was observed after annealing the schemes at 400° C. for 100 hours and at 900° C. for 30 minutes. Thermal cycling experiments in air from –65 to 155° C. and adhesion tests were performed. Various embodiments are disclosed.

18 Claims, 1 Drawing Sheet

OTHER PUBLICATIONS

Tantalum–Based Encapsulants for Thermal Annealing of GaAs, J.M. Molarius et al., J. Electrochem. Soc., vol. 138, No. 3, 1991.

Ta–Si–N and $Si_3N_4$ Encapsulants for InP, J.S. Reid et al., Mat. Res. Soc. Symp. Proc., vol. 260, 1992.

Stable Pt/Ge/Au Ohmic Contact to n–GaAs with a Ta–Si–N Barrier, J.S. Chen et al., Mat. Res. Soc. Symp. Proc., vol. 300, 1993.

Ohmic Contacts to n–GaAs with a Pt/Ge/Au Contacting Layer and a Ta–Si–N Barrier: Electrical and Metallurgical Characteristics, J.S. Chen et al., J. Appl. Phys. 75 (11), Jun. 1, 1994.

Morphology and Thermal Stability of Me–Si–N (Me=Re, W, Ta) for Microelectronics, A.–M. Dutron et al., Journal De Physique IV, vol. 5, Juin 1995.

Reliability of High Temperature Metallizations with Amorphous Ternary Diffusion Barriers, E. Kolawa et al., California Institute of Technology, Pasadena, CA and Jet Propulsion Laboratory, Pasadena, CA.

Au/(Ti–W) and Au/Cr Metallization of Chemically Vapor–Deposited Diamond Substrates for Multichip Module Applications, I. Meyyappan et al., *Thin Solid Films* 253 (1994) 407–412.

Elastic Scattering of Alpha–Particles by Carbon, Richard William Hill, *Physical Review,* vol. 90, No. 5, Jun. 1, 1953.

Diffusion in Thin Film Ti–Au, Ti–Pd, and Ti–Pt Couples, T.C. Tisone et al., *The Journal of Vacuum Science and Technology,* vol. 9, No. 1, 271–275.

Ti–Si–N Diffusion Barriers Between Silicon and Copper, J.S. Reid, *IEEE Electron Device Letters,* vol. 15, No. 8, Aug. 1994.

Thermal Stability and Nitrogen Redistribution in the <Si>/Ti/W–N/Al Metallization Scheme, E. Kolawa et al., *The Journal of Vacuum Science and Technology,* vol. 4, No. 6, Nov./Dec. 1986.

STABLE METALLIZATION FOR DIAMOND AND OTHER MATERIALS

STATEMENT OF GOVERNMENT INTEREST

The U.S. Government has certain rights in this invention pursuant to Grant No. DAAL03-92-G-0045 awarded by the U.S. Army. The invention described herein was made in the performance of work under NASA contract, and is subject to the provision of Public Law 96-517 (35 U.S.C. §202) in which the Contractor has elected to retain title.

BACKGROUND OF THE INVENTION

1. Field of the Invention

This invention relates to the field of metallization of diamond and various other materials in electronic packaging and other applications wherein thin metallization layers are desired or required, and more particularly wherein high temperature stability of thin metallization layers during further processing and/or device operation is required.

2. Prior Art

In electronic devices and electronic device packaging, metal-diamond contacts are needed for most applications of CVD (chemical vapor deposition) diamond. The requirements on such contacts vary greatly from application to application. Important for many of them are metallurgical stability at elevated temperatures and good adhesion, as for example for the bonding of components on CVD diamond heat sinks for multi-chip modules. These two requirements, however, are difficult to meet with a single film, since good adhesion requires a reaction between the covalently bonded diamond and the metal. The metallization schemes available today for diamond consist of a thin adhesion layer, typically titanium (Ti) or chromium (Cr), that bonds a thicker metal or alloy layer, typically gold (Au) or gold-tin (Au—Sn) to the diamond substrate. Unless the interaction is efficiently prevented, Cr from the adhesion layer will be dissolved in the thicker Au film, since the solubility of Cr in Au is substantial at elevated temperatures. (See *Binary Alloy Phase Diagrams* 2nd Ed., T. B. Massalski, ASM International, (1990).) The same holds true for Ti in Au, where titanium-gold compounds can form as well. (See *Binary Alloy Phase Diagrams* 2nd Ed., T. B. Massalski, ASM International, (1990) and *J. Vac. Sci. Technol.* 9, T. C. Tisone and J. Drobeck, (1972) 271.) These metallurgical interactions degrade the thermal and electrical properties at the bond and decrease the adhesion of the metallization layer, limiting the use of these metallizations to below 200–300° C. The limit for metallizations that use titanium/platinum/gold (Ti/Pt/Au) or titanium-tungsten/gold (Ti—W/Au) metallization schemes to impede diffusion is 450° C. (See *ICEMM Proc.* '93, H. A. Naseem, I. Meyyappan, C. S. Prasad, W. D. Brown, (1993) 62, and *Thin Solid Films* 253, I. Meyyappan, A. P. Malshe, H. A. Naseem, W. D. Brown, (1994) 407.) All the commercially available diamond metallization schemes tested by the inventors of the present invention degraded upon vacuum annealing above 450° C.

BRIEF SUMMARY OF THE INVENTION

A diamond metallization using a thin Ti—Si—N film as a diffusion barrier is presented. The system diamond/Ti/Ti—Si—N/Ti/Au is well adherent to polished diamond after thermal cycling and it is metallurgically stable to 900° C. No interdiffusion was detected by backscattering spectrometry after vacuum annealing the sample at 400° C. for 100 hours. Its performance is thus believed to be superior compared to prior art metallization schemes wherein interdiffusion of the adhesion layer and Au, observed below 200–300° C., is a limiting factor.

While the preferred embodiment of the present invention uses Ti in the amorphous ternary compound diffusion barrier layer, other early transition metals may also be used, such as vanadium (V), chromium (Cr), zirconium (Zr), niobium (Nb), molybdenum (Mo), hafnium (Hf), tantalum (Ta) and tungsten (W).

Also while the preferred embodiment of the present invention uses thin Ti films to promote the adhesion between the diamond substrate and the amorphous ternary layer, as well as between that layer and the Au overlayer. Other reactive transition elements may also be used, such as V, Cr, Zr, Nb, Mo, Hf, Ta or W.

The present invention is also not necessarily limited to use in forming metallized layers on diamond. By way of example the invention may be useful to metallize substrates of all crystallographic forms, ranging from ceramic to single-crystalline, of SiC, GaN, AlN, $Al_2O_3$ or of other refractory carbides, nitrides and oxides. The invention may also be useful to metallize other wide bandgap or refractory semiconductors.

DETAILED DESCRIPTION OF THE INVENTION

Figures 1, 2:
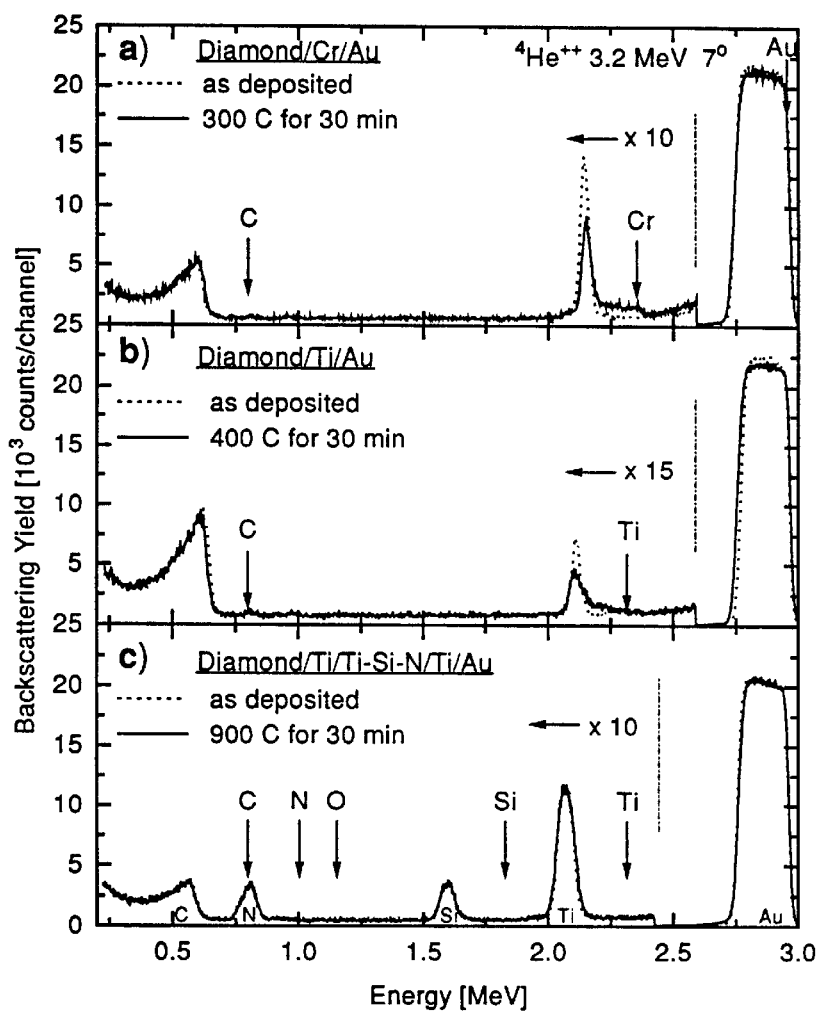
FIG. 1 presents schematic cross sections (not to scale) of as-deposited test samples together with the abbreviations used to refer to these samples.
FIG. 2, consisting of FIGS. 2a, 2b and 2c, illustrates the detection of temperature induced interdiffusion between the various layers by comparing the backscattering spectra of annealed samples with the spectra of their unannealed reference sample.

Presented herein is a diamond/Ti/Ti—Si—N/Ti/Au metallization that has a metallurgical stability greatly superior to the currently used metallization schemes. It contains a reactively sputter-deposited amorphous Ti—Si—N (titanium-silicon-nitrogen) film originally developed as a diffusion barrier between silicon substrates and copper overlayers. (See *IEEE Electron Device Let.* 15, J. S. Reid, X. Sun, E. Kolawa, M-A. Nicolet, (1994) 298.) This exceptional diffusion barrier much enhances the performance of diamond metallization schemes. The stability of this metallization is described and compared with a similar scheme (diamond/Cr/Ti—Si—N/Cr/Au) where Cr instead of Ti is used as the adhesion layer, and with the corresponding metallizations that do not contain the diffusion barriers (diamond/Ti/Au and diamond/Cr/Au).

EXPERIMENTAL PROCEDURE

The diamond substrates used for evaluation were polished 250 µm-thick free-standing CVD-grown wafers. Prior to metal depositions the diamond wafers were annealed in a flow of forming gas at 650° C. for 3 hours. Thin films were then deposited by rf-magnetron sputtering in a vacuum chamber with $2 \times 10^{-7}$ Torr base pressure. The contact schemes were prepared by sequential deposition of thin layers onto the diamond substrates without breaking vacuum. Four types were prepared. The schematic cross sections (not to scale) of the as-deposited samples together with the abbreviations used to refer to these samples (Cr, Cr+DB, Ti, Ti+DB) are shown in FIG. 1 (DB=amorphous Ti—Si—N diffusion barrier). Metal targets and Argon (Ar) gas were used to sputter-deposit the Cr and Ti films while the amorphous Ti—Si—N films were reactively sputter-deposited with Ti$_5$Si$_3$-composite targets in a mixture of Ar and N$_2$. (See *IEEE Electron Device Let.* 15, J. S. Reid, X. Sun, E. Kolawa, M-A. Nicolet, (1994) 298.)

One sample of each type was kept as a reference. A second sample was thermally cycled 100 times between −65° C. and 155° C. in dry air according to MIL STD 883. Adhesion tests were performed on these samples after thermal cycling using a 64 ounce/inch tape. A third sample of each type was annealed in a vacuum tube furnace (5×10$^7$ Torr) at 200° C. for 30 minutes. Annealing for 30 minutes at a higher temperature was repeated with those samples until atomic interdiffusion could be detected by backscattering spectrometry.

The elemental composition profiles of all thermally cycled and all furnace-annealed samples together with their respective reference samples were characterized by 3.2 MeV $^4$He$^{++}$ backscattering spectrometry. The cross section of the He-carbon scattering is enhanced at this energy, allowing one to also detect a change in the carbon concentration close to the diamond-metal interface. (See *Phys. Rev.* 90, R. W. Hill, (1953) 845.) The samples were tilted 7° against the incident He (helium) beam direction. The scattering angle of the detected particles was 170°.

RESULTS AND DISCUSSION

TABLE 1

Interdiffusion between the Cr or Ti and Au overlayer detected by backscattering spectrometry after vacuum annealing. i: interdiffusion is observed; ni: no interdiffusion is observed; ii: initial interdiffusion is observed; d: delamination

|  | Cr | Cr + DB | Ti | Ti − DB |
|---|---|---|---|---|
| as deposited | ni | ni | ni | ni |
| 200° C./30 min | ni | ni | ni | ni |
| 300° C./30 min | ii | ii | ni |  |
| 400° C./30 min | i + d |  | ii | ni |
| 500° C./30 min |  |  | i |  |
| 600° C./30 min |  | i |  | ni |
| 700° C./30 min |  |  |  | ni |
| 800° C./30 min |  |  |  | ni |
| 900° C./30 min |  |  |  | ni |
| 400° C./100 hr |  |  |  | ni |

Table 1 summarizes the backscattering data on interdiffusion after vacuum annealing for 30 minutes. It shows the temperatures at which no interdiffusion (ni), initial interdiffusion (ii) or reaction (i), or delamination (d) has occurred. Comparing the backscattering spectra of annealed samples with the spectra of their reference sample, as is shown in FIG. 2, permits the detection of interdiffusion between the various layers. Except during the initial stages, the interdiffusion of Cr or Ti with Au was accompanied with a color change of the Au film. Table 1 shows that the metallization scheme with the Ti adhesion layers and the ternary diffusion barrier (Ti+DB sample) is metallurgically much more stable than the Ti, the Cr, and the Cr+DB samples.

Chromium diffuses substantially into the Au film at 300° C. (FIG. 2a). The adhesion of this film is so poor after the 400° C. annealing that it peals off upon gentle handling with tweezers. At 300° C., interdiffusion is also observed between the Cr and the Au film above the barrier in the Cr+DB sample. The Cr adhesion layer below the barrier, however, remains unchanged, which means that the barrier is tight. Even after annealing at 600° C. there is no diffusion observed in the adhesion layer below the barrier and there are no signs of delamination in the Cr+DB sample.

The onset of interdiffusion in the Ti sample between the Ti and the Au bilayer is observed after annealing at 400° C. (FIG. 2b). In the Ti+DB sample there is no discoloration and no detectable interdiffusion in the annealed samples, not even after annealing at 900° C. (FIG. 2c). No tests were performed at higher temperatures, as the gold would evaporate. There is no discoloration and no interdiffusion within the layered Ti+DB sample after vacuum annealing a sample at 400° C. for 100 hours. No specific adhesion tests were made on the annealed samples. However, no delamination due to normal handling of the metal film was observed after annealing the Ti+DB sample at 900° C. and the Cr+DB sample at 600° C.

While the interdiffusion of Cr into Au is observed at the same temperature for the Cr+DB sample as for the Cr sample, no interdiffusion of Ti into Au is detected up to 900° C. in the Ti+DB sample, but is detected at 400° C. in the Ti sample. This difference can be attributed to the huge heat of formation of TiN ($\Delta G=-266$ KJ/mol) compared to that of CrN ($\Delta G=-60$ KJ/mol). (See *Smithells Metals Reference Book*, 7th Ed., E. A. Brandes, G. B. Brook (1992), Pg. 872.) Nitrogen from the barrier might redistribute into the titanium layers to form the very stable TiN as is known for W—N/Ti. (See *J. Vac. Sci. Technol. A* 4, F.C.T. So., E. Kolawa, H. P. Kattelus, X.-A. Zhao, M-A. Nicolet, C.-D. Lien, (1986) 3078.)

No changes in the surface appearance (optical microscopy) and the composition profiles (backscattering spectrometry) were observed after thermally cycling the four different sample types, as deposited, one hundred times between −65° C. and 155° C. Tape-adhesion tests performed on these samples show that the adhesion after thermal cycling is poorest for the Ti and the Cr samples (film pealed off completely), is better for the Cr+DB sample (50% of the film stayed on), and is best for the Ti+DB sample (90% of the film stayed on). Although not a quantitative measurement, this tape-adhesion test result reveals that the adhesion of the Ti+DB metallization is superior to that of the three other metallization schemes discussed here.

CONCLUSION

A diamond metallization using the Ti—Si—N as a diffusion barrier is presented. The system Ti/Ti—Si—N/Ti/Au adheres well to polished diamond after thermal cycling and it is metallurgically stable to 900° C. No interdiffusion was detected after vacuum annealing the sample at 400° C. for 100 hours. Its performance is thus believed to be superior compared to prior art metallization schemes wherein interdiffusion of the adhesion layer and Au, observed below 200–300° C., is a limiting factor.

The present invention may be distinguished over the prior art in various ways. In particular many prior art techniques for providing metallization on diamond are directed to the single problem of providing adhesion in a mechanical sense between the metallized layer and diamond particles, as in the manufacture of diamond abrasive wheels and the like. To the extent that the same have any unusual elevated temperature capabilities, it may be because of the much thicker metallization layers used, which take longer times at temperature for diffusion all the way through the layers to occur. In the case of semiconductor manufacture for metallizing a heat spreading diamond substrate for forming a ground plane thereon, and particularly where the metallized layer must be very accurately patterned, as in integrated circuit interconnects, only relatively thin metallized layers may be used, typically on the order of 100 nanometers, wherein nearly any significant diffusion rate between layers at a particular temperature will result in the loss of integrity of the composition of the entire layer when at that temperature for any significant time. Such high temperature exposure may be the result of further device processing, or device operation either under high temperature ambient conditions or because of high power operation in lower ambient temperatures.

The preferred embodiment of the present invention uses Ti in the amorphous ternary compound diffusion barrier layer, most preferably a Ti—Si—N layer having a composition $Ti_xSi_yN_z$ of approximatrely $$\frac{z}{x+y} < 0.5$$

and $$\frac{1}{2} < \frac{x}{y} < 3.$$

However, other early transition metals may also be used, such as vanadium (V), chromium (Cr), zirconium (Zr), niobium (Nb), molybdenum (Mo), hafnium (Hf), tantalum (Ta) and tungsten (W). Ternary compounds as used herein is used to include three element compounds as well as crystalline structures in an amorphous matrix. Also amorphous as used herein is used to designate a noncrystalline material.

In the preferred embodiment presented herein, the initial early transition metal (Ti) is used not only in the Ti—Si—N barrier layer, but also as the adhesion layer between the diamond and the barrier layer, and between the barrier layer and the gold layer. However other early transition metals may also be used for either or both adhesion layers, such as vanadium, chromium, zirconium, niobium, molybdenum, hafnium tantalum or tungsten. In that regard, it will be noted from the test results herein before presented that when using chromium as the adhesion layer between the barrier layer and the gold layer, interdiffusion between the chromium and the gold layer was noted in annealing the test specimen for 30 minutes above 200° C. This however does not mean that such a combination is not useful in certain cases if exposure above 200° C. for 30 minutes or longer is required, as such interdiffusion does not really impair the function of the gold layer, and the barrier layer prevents the interdiffusion from penetrating to the diamond-barrier layer interface, thereby preventing degradation of the adhesion to the diamond. In all test samples with a barrier, no interdiffusion of the adhesion layer next to the diamond across the barrier layer was observed. The adhesion of the Cr sample with the barrier is thus superior to that without the barrier. The fact that there is no diffusion across the barrier layer is an important aspect of the invention, as this prevents the most critical adhesion layer, that next to the diamond, from disappearing.

The present invention is not necessarily limited to use in forming metallized layers on diamond. By way of example the invention may be useful to metallize silicon carbide, gallium nitride, ceramic substrates, or other substrates and single crystals of all crystallographic forms. The invention may also be useful to metallize wide bandgap (or refractory) semiconductors, such as carbides and nitrides.

Thus, while the present invention has been disclosed and described with respect to certain preferred embodiments thereof, it will be understood to those skilled in the art that the apparatus and methods of the present invention may be varied without departing from the spirit and scope of the invention.

What is claimed is:

1. A method of providing a metallized layer on the surface of a diamond material comprising:

(a) depositing an adhesion layer of metal on the surface of the diamond material;

(b) depositing a layer of a ternary compound of the early transition metal-Si—N type on the surface of the metal layer formed in step (a), said layer of ternary compound preventing interdiffusion across said layer of ternary compound; and (c) depositing a layer of metal over the ternary compound formed in step (b).

2. The method of claim 1 wherein the layer of a ternary compound of the early transition metal-Si—N is reactively sputter deposited.

3. The method of claim 1 wherein the early transition metal in the layer of a ternary compound is selected from the group consisting of vanadium, chromium, zirconium, niobium, molybdenum, hafnium, tantalum, titanium and tungsten.

4. The method of claim 1 wherein the early transition metal in the layer of a ternary compound is titanium.

5. The method of claim 1 wherein the adhesion layer of metal on the surface of the material is selected from the group consisting of vanadium, chromium, zirconium, niobium, molybdenum, hafnium, tantalum, titanium and tungsten.

6. The method of claim 1 wherein the method is for providing a metallization for substrates of all crystallographic forms of SiC, GaN, AlN, $Al_2O_3$ and of other refractory carbides, nitrides and oxides.

7. The method of claim 1 wherein the method is for providing a metallized layer on the surface of a wide bandgap semiconductor.

8. The method of claim 1 wherein depositing a layer of metal over the ternary compound comprises depositing a layer of gold over the ternary compound formed.

9. The method of claim 1 wherein the method is for providing a metallized layer on the surface of diamond.

10. A method of providing a metallized layer on the surface of a diamond material comprising:

(a) depositing a layer of an early transition metal on the surface of the diamond material;

(b) depositing a layer of a ternary compound of an early transition metal-Si—N type on the surface of the early transition metal formed in step (a), said layer of ternary compound preventing interdiffusion across said layer of ternary compound;

(c) depositing a layer of an early transition metal on the surface of the ternary compound formed in step (b); and, (d) depositing an additional layer metal over th e layer of the early transition metal formed in step (c).

11. The method of claim 10 wherein the the early transition metal used in step (b) is a different early transition metal than used in steps (a) and (c).

12. The method of claim 10 wherein the the early transition metal used in step (b) is the same early transition metal as used in steps (a) and (c).

13. The method of claim 10 wherein the layer of a ternary compound of the early transition metal-Si—N is reactively sputter deposited.

14. the method of claim 10 wherein the additional layer of metal of step (d) is gold.

15. The method of claim 10 wherein the method is for providing a metallized layer on the surface of diamond.

16. A method of providing a metallized layer on the surface of diamond comprising:

(a) depositing a layer of an early transition metal on the surface of the diamond;

(b) depositing a layer of a ternary compound of Ti—Si—N on the surface of the early transition metal formed in step (a), said layer of ternary compound preventing interdiffusion across said layer of ternary compound;

(c) depositing a layer of an early transition metal on the surface of the ternary compound formed in step (b); and, (d) depositing a layer of gold over the layer of the early transition metal formed in step (c).

17. The method of claim 16 wherein the early transition metal used in steps (a) and (c) is titanium.

18. The method of claim 16 wherein the early transition metal used in step (c) is a metal other than titanium.

* * * * *

UNITED STATES PATENT AND TRADEMARK OFFICE
CERTIFICATE OF CORRECTION

PATENT NO. : 6,114,256
DATED : September 5, 2000
INVENTOR(S) : Bachli et al.

It is certified that error appears in the above-identified patent and that said Letters Patent is hereby corrected as shown below:

Title page,
Item [56], References Cited, U.S. PATENT DOCUMENTS, "5,272,104" reference, please delete "Schranta" and insert -- Schrantz --.

Column 6,
Line 49, please delete "th e" and insert -- the --.

Signed and Sealed this

Nineteenth Day of April, 2005

JON W. DUDAS
*Director of the United States Patent and Trademark Office*